(12) United States Patent
Miller

(10) Patent No.: US 6,606,014 B2
(45) Date of Patent: Aug. 12, 2003

(54) FILTER STRUCTURES FOR INTEGRATED CIRCUIT INTERFACES

(75) Inventor: Charles A. Miller, Fremont, CA (US)

(73) Assignee: FormFactor, Inc., Livermore, CA (US)

( * ) Notice: Subject to any disclaimer, the term of this patent is extended or adjusted under 35 U.S.C. 154(b) by 146 days.

(21) Appl. No.: 09/816,889

(22) Filed: Mar. 23, 2001

(65) Prior Publication Data

US 2001/0054938 A1 Dec. 27, 2001

Related U.S. Application Data

(63) Continuation-in-part of application No. 09/258,184, filed on Feb. 25, 1999, now Pat. No. 6,208,225.

(51) Int. Cl.⁷ .............................. H01P 1/04; H01P 1/20; H01P 1/00; H03H 7/38
(52) U.S. Cl. .................... 333/33; 333/202; 333/260; 333/247
(58) Field of Search .................... 333/33, 247, 246, 333/202, 204, 24 C, 167, 260

(56) References Cited

U.S. PATENT DOCUMENTS

| 4,342,013 A | 7/1982 | Kallman |
| 4,354,268 A | 10/1982 | Michel et al. |
| 4,472,725 A | 9/1984 | Blumenkranz |
| 4,523,312 A | 6/1985 | Takeuchi |
| 4,616,178 A | 10/1986 | Thornton, Jr. et al. |
| 4,837,622 A | 6/1989 | Whann et al. |
| 5,012,213 A | 4/1991 | Tsai |
| 5,090,118 A | 2/1992 | Kwon et al. |
| 5,182,220 A | 1/1993 | Ker et al. |
| 5,270,673 A | 12/1993 | Fries et al. |
| 5,309,019 A | 5/1994 | Moline et al. |
| 5,406,210 A | 4/1995 | Pedder |
| 5,424,693 A | 6/1995 | Lin |
| 5,466,892 A | * 11/1995 | Howard et al. ............. 174/261 |
| 5,532,506 A | 7/1996 | Tserng |
| 5,536,906 A | 7/1996 | Hass, Jr. et al. |
| 5,544,018 A | * 8/1996 | Sommerfeldt et al. ...... 361/792 |
| 5,546,405 A | 8/1996 | Golla |
| 5,642,054 A | 6/1997 | Pasiecznik, Jr. |
| 5,744,869 A | 4/1998 | Root |
| 5,869,898 A | 2/1999 | Sato |
| 5,901,022 A | 5/1999 | Ker |
| 5,967,848 A | * 10/1999 | Johnson et al. ............. 439/620 |
| 5,969,929 A | 10/1999 | Kleveland et al. |
| 6,008,533 A | 12/1999 | Bruce et al. |
| 6,015,722 A | * 1/2000 | Banks et al. ................ 438/108 |

FOREIGN PATENT DOCUMENTS

| EP | 513992 | 6/1992 |
| EP | 851555 | 7/1998 |
| GB | 2303495 | 2/1997 |
| JP | 2-094693 | 4/1990 |
| JP | 04107940 | 4/1992 |
| JP | 9-321433 | 12/1997 |
| JP | 11-054869 | 2/1999 |
| JP | 11-150371 | 6/1999 |

(List continued on next page.)

OTHER PUBLICATIONS

Patent Abstracts of Japan, "Semiconductor Device and Its Component Parts", vol. 16, No. 347, Jul. 27, 1992.
Hayward, "Introduction to Radio Frequency Design", Prentice Hall, Inc., 1982, Englewood Cliffs, New Jersey, pp. 59–68.

Primary Examiner—Patricia Nguyen
(74) Attorney, Agent, or Firm—Smith-Hill and Bedell

(57) ABSTRACT

An interconnect system for linking integrated circuits (ICs) mounted on a surface of a printed circuit board (PCB) includes a trace positioned below the surface, one or more vias linking the trace to the surface of the PCB, and other conductors linking pads on the ICs to the vias. Impedances of the various components of the interconnect system are sized relative to one another to optimize interconnect system frequency response.

34 Claims, 3 Drawing Sheets

FOREIGN PATENT DOCUMENTS

| | | |
|---|---|---|
| JP | 2000-208887 | 7/2000 |
| WO | WO 9615458 | 5/1996 |
| WO | WO 98/47190 A1 | 10/1998 |
| WO | WO 9852224 | 11/1998 |

* cited by examiner

FILTER STRUCTURES FOR INTEGRATED CIRCUIT INTERFACES

CROSS-REFERENCE TO RELATED APPLICATIONS

The subject matter of the present application is a continuation-in-part of copending U.S. application Ser. No. 09/258,184 FILTER STRUCTURES FOR INTEGRATED CIRCUIT INTERFACES filed Feb. 25, 1999, now U.S. Pat. No. 6,208,225.

BACKGROUND OF THE INVENTION

1. Field of the Invention

The present invention relates in general to systems for interconnecting integrated circuits mounted on a circuit board and in particular to an interconnect system that provides a filter and impedance matching function.

2. Description of Related Art

Each node of an integrated circuit (IC) that is to communicate with external circuits is linked to a bond pad on the surface of the IC chip. In a packaged IC a bond wire typically connects the bond pad to a conductive leg extending from the package surrounding the IC chip. When the IC is mounted on a printed circuit board (PCB), the package leg is soldered to a microstrip PCB trace on the surface of the PCB. When bond pads of one or more other ICs mounted on the PCB are linked to the PCB trace, the bond pads, bond wires, package legs, and the PCB trace form an interconnect system for conveying signals between nodes of two or more ICs.

In high frequency applications the interconnect system can attenuate and distort signals. The conventional approach to reducing the amount of signal distortion and attenuation caused by the interconnect system has been to minimize the series inductance and shunt capacitance of the interconnect system. Much of the inductance comes from the bond wire and the package leg, and such inductance can be minimized by keeping the bond wire and package leg as short as possible. The capacitance of the bond pads can be reduced to some extent by minimizing the surface area of the bond pads. The capacitance of PCB traces can be reduced by appropriately choosing physical characteristics of the board including the size of the PCB traces, their spacing from ground planes and dielectric nature of the insulating material forming the circuit board. Vias, conductors passing vertically through a circuit board to interconnect PCB traces on various layers of the PCB, can be a source of capacitance at the PCB trace. Designers often avoid the use of vias in high frequency applications because vias can add substantial capacitance to the interconnect system. When vias are unavoidable, designers typically structure them so as minimize their capacitance. Minimizing the bond wire and package leg inductance and capacitances of the bond pad and PCB can help increase the bandwidth, flatten frequency response and reduce the signal distortion, but it is not possible to completely eliminate interconnect system inductance and capacitance. Thus some level of signal distortion and attenuation is inevitable when signal frequencies are sufficiently high.

What is needed is a way to substantially improve the frequency response of the interconnect system so as to reduce distortion and attenuation of high frequency signals.

SUMMARY OF THE INVENTION

The present invention is an improvement to a conventional system for interconnected integrated circuits (ICs) mounted on top of a printed circuit board (PCB). The conventional interconnect system employs a conductor (typically a bond wire and package leg) and a via to connect a bond pad on the surface of each IC to a PCB trace formed on the bottom side or an inner layer of the PCB so that the ICs can communicate with each other through the PCB trace. The inductance of the bond wires, package legs and vias, the capacitances of the bond pads, PCB trace and vias, the impedances of the IC devices connected to the pads, and impedance of the PCB trace cause the interconnect system to distort, reflect and attenuate signals as they pass between the IC bond pads.

In accordance with the invention, the interconnect system is improved by adapting it to provide a filter function that is optimized for the nature of the signals passing between the ICs by appropriately adjusting path inductances and capacitances relative to one another. The component values are adjusted to optimize relevant characteristics of the interconnect system frequency response. For example when the ICs communicate using low frequency analog signals where it is most important to avoid distortion, the "optimal" frequency response may have a narrow, but maximally flat, pass band. Or, as another example, when the ICs communicate via high frequency digital signals, the optimal frequency response may have a maximally wide passband.

It is accordingly an object of the invention to provide a system for interconnecting integrated circuits mounted on a printed circuit board wherein the frequency response of the interconnect system is optimized for the nature of signals passing between the ICs.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

DESCRIPTION OF THE PREFERRED EMBODIMENT(S)

Prior Art Interconnect System

Figure 1:
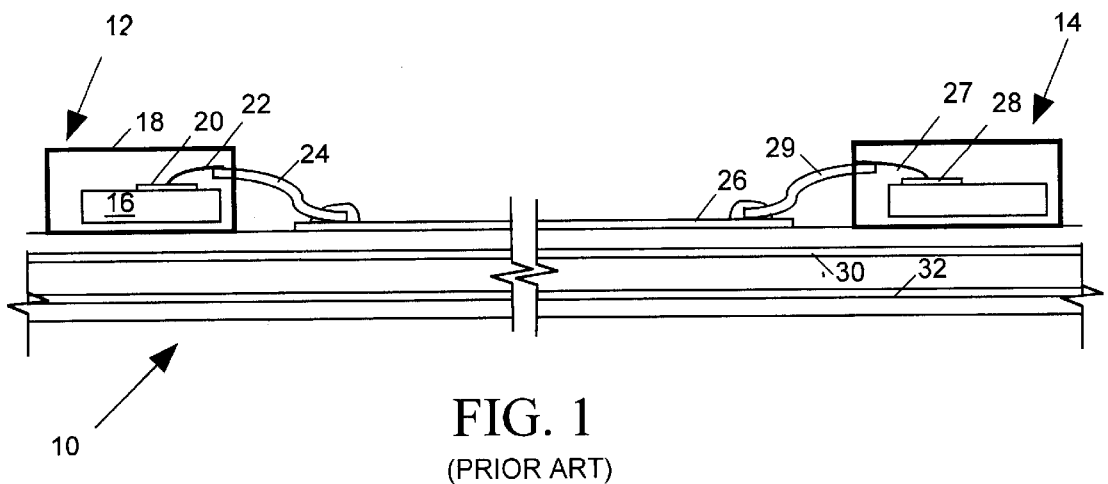
FIG. 1 is a simplified sectional elevation view of a portion of a prior art printed circuit board upon which is mounted a pair of integrated circuits.

The present invention is an improvement to a prior art interconnect system for conveying signals between integrated circuits mounted on a printed circuit board. FIG. 1 is a simplified sectional elevation view of the prior art interconnect system, including a printed circuit board (PCB) 10 upon which is mounted a pair of integrated circuits (ICs) 12 and 14. IC 12 includes an integrated circuit chip 16 contained within an IC package 18. A bond pad 20 on the surface of chip 16 acts as an input/output (I/O) terminal for signals entering and/or departing chip 16. A typical IC will include several bond pads, but for simplicity only one is shown in FIG. 1. A bond wire 22 links bond pad 20 to a conductive leg 24 extending outward from package 18. Leg 24 is typically soldered onto a microstrip PCB trace 26 on the surface of PCB 10. Bond wire 22 and leg 24 together form a path for conveying signals between bond pad 20 and PCB trace 26. When a bond pad 28 in IC 14 is connected to microstrip PCB trace 26 in a similar manner through a bond wire 27 and a package leg 29, ICs 12 and 14 can transmit signals to one another via PCB trace 26. PCB board 10 also includes a conductive ground plane 30 and a conductive power plane 32 between layers of dielectric material for delivering ground and power throughout PCB 10.

Figure 2:
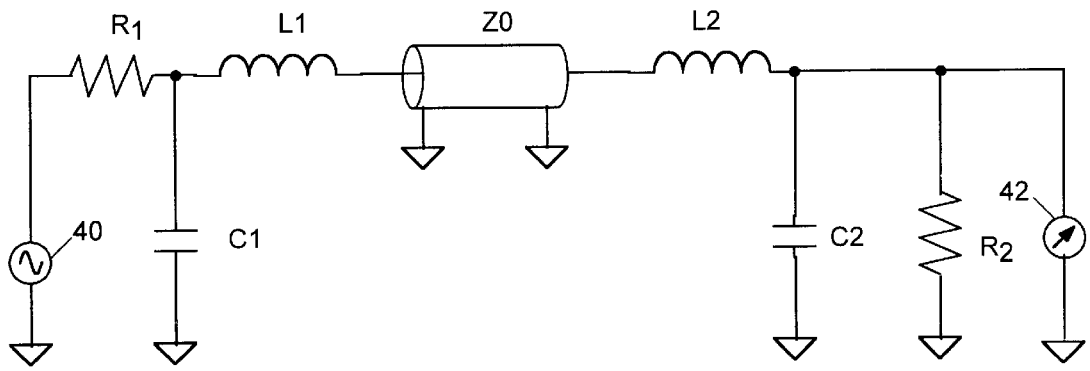
FIG. 2 is an equivalent circuit diagram modeling the ICs of FIG. 1 and the prior art structure interconnecting them.

FIG. 2 is an equivalent circuit diagram modeling PCB 10, ICs 12 and 14 of FIG. 1 and the various structures interconnecting them. IC 12 is modeled as an ideal signal source 40 transmitting a signal through a resistance $R_1$. The capacitance to ground at bond pad 20, including the capacitance of the driver and any electrostatic discharge (ESD) protection device connected to bond pad 20, is modeled as a single capacitor C1. Bond wire 22 and the package leg 24 form a transmission line that is primarily inductive at higher signal frequencies. Bond wire 22 and package leg 24 are therefore modeled as a single inductor L1. IC 14 is modeled as an ideal signal receiver 42 having input impedance $R_2$ connected to bond pad 28. The capacitance at bond pad 28, including the capacitance of any driver, ESD or other device connected to pad 28 is modeled as a capacitor C2. The inductances of bond wire 27 and 29 are modeled as a single inductor L2. Trace 26 is modeled as a microstrip transmission line having a series characteristic impedance Z0.

The circuit formed by capacitors C1, C2, inductors L1 and L2, resistors R1 and R2, and impedance Z0 has a reactive impedance that can substantially attenuate and distort signals passing between driver 40 and receiver 42. The conventional approach to reducing the amount of signal distortion and attenuation in high frequency applications has been to minimize bond wire inductances L1 and L2 and capacitances C1 and C2. Inductance L1 and L2 are minimized by keeping bond wires 20, 27 and package legs 24, 29 as small as possible. Capacitances C1 and C2 are minimized by keeping bond pads 20 and 28 as small as possible.

Table I below lists impedance values of the various interconnect system components of the prior art equivalent circuit of FIG. 2 that are typical in high frequency applications.

TABLE I

| ELEMENT | IMPEDANCE |
| --- | --- |
| L1 | 1nH |
| L2 | 1nH |
| C1 | 2pF |
| C2 | 2pF |
| Z0 | 50 Ohms |
| $R_1$ | 50 Ohms |
| $R_2$ | 50 Ohms |

Figure 3:
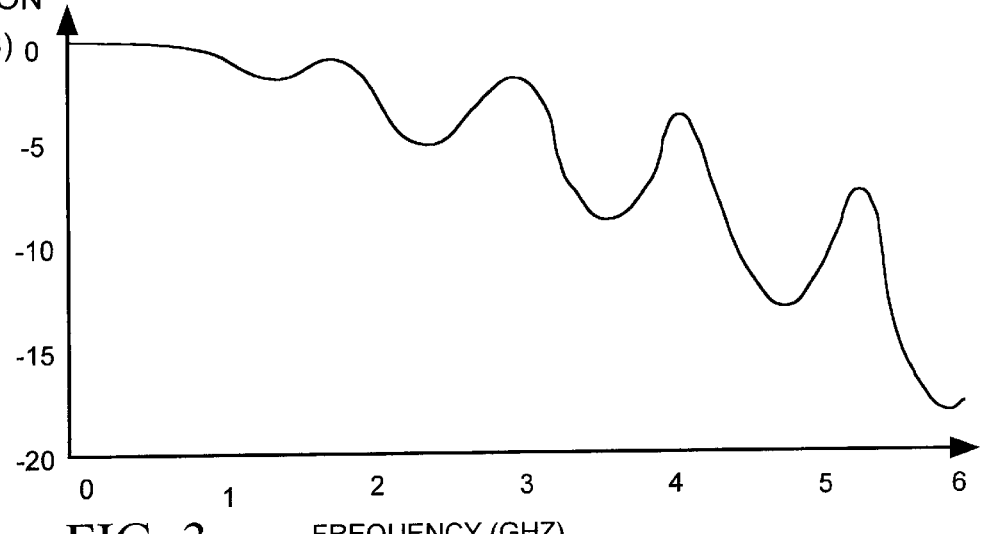
FIG. 3 illustrates the frequency response characteristics of the prior art interconnect system of FIGS. 1 and 2.

FIG. 3 illustrates the frequency response characteristics of the prior art interconnect system of FIGS. 1 and 2 when components are set to the values indicated in Table I. The desired frequency response characteristics for an interconnect system depends on its application. For example, when the interconnect system is to convey an analog signal with little distortion or noise, it is usually desirable that the passband be only as wide as needed to pass the highest frequency signal expected, that the passband be as flat as possible to avoid signal distortion, and that all areas of the stopband have maximal attenuation so as to block high frequency noise. Suppose we want to use the interconnect system of FIG. 2 to convey an analog signal having components up to 3 GHz. We first note that the passband (approximately 2 GHz) is not wide enough for the application. We also note that the passband is not particularly flat between 1 and 2 GHz. Thus the interconnect system will severely attenuate signal frequency components above 2 GHz and will distort signals having frequency components above 1 GHz. We also note that the stopband has large peaks at several frequencies above 2 GHz and may therefore fail to sufficiently attenuate noise at those frequencies.

Improved Interconnect System

Figure 4:
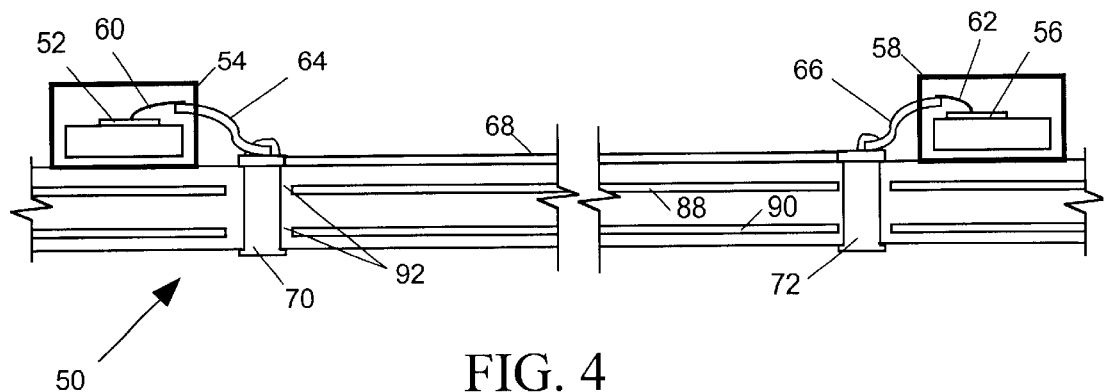
FIG. 4 is a simplified sectional elevation view of a portion of a printed circuit board upon which is mounted a pair of integrated circuits, wherein the integrated circuits are interconnected in accordance with a first embodiment of the present invention.

FIG. 4 illustrates a PCB 50 implementing an improved interconnect system in accordance with a first embodiment of the present invention for interconnecting a bond pad 52 in one IC 54 to a bond pad 56 in another IC 58. Bond wires 60 and 62 connect pads 52 and 56 to package legs 64 and 66 which are in turn soldered to a PCB trace 68 on the upper surface of PCB 50. A conductive via 70 passes through PCB 50 and contacts PCB trace 68 near the point of contact between leg 64 and PCB trace 68. Similarly a via 72 passes through PCB 50 and contacts PCB trace 68 near its point of contact with leg 66.

Figure 5:
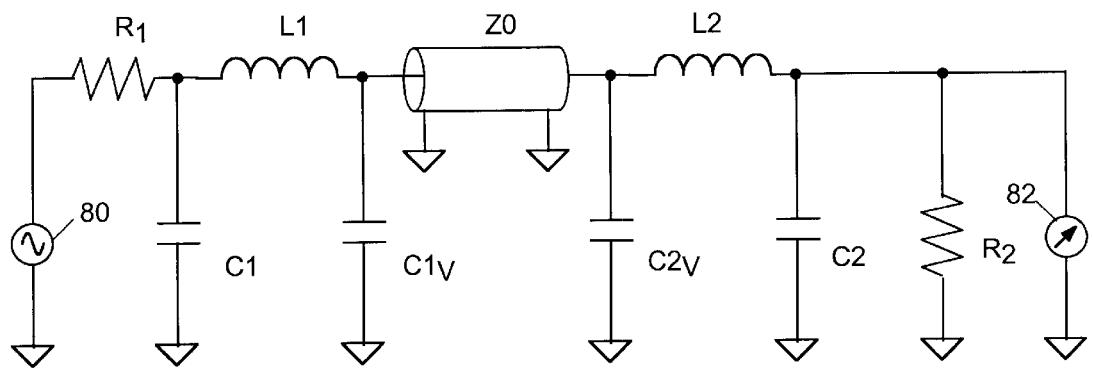
FIG. 5 is an equivalent circuit diagram modeling the ICs of FIG. 4 and the structure interconnecting them.

FIG. 5 is an equivalent circuit diagram of the interconnect system of FIG. 4 in accordance with the invention. A driver 80 within IC 54 is connected to pad 52 through impedance $R_1$ and a receiver 82 having input impedance $R_2$ within IC 58 is connected to pad 56. Bond wire 60 and package leg 64 are modeled as inductance L1 while bond wire 62 and package leg 66 are modeled as inductance L2. The capacitances of pads 52 and 56 appear in FIG. 5 as capacitors C1 and C2 and the impedance of PCB trace 68 appears as its characteristic impedance Z0. Since vias 60 and 72 are primarily capacitive, their capacitances appear in FIG. 5 as capacitors $C1_V$ and $C2_V$.

The interconnect system of 5 is topologically similar to the prior art system of FIG. 2 except for the addition of the shunt capacitors $C1_V$ and $C2_V$ at opposite ends of impedance Z0. Although vias 70 and 72 can be conveniently used to connect PCB trace 72 to traces on other layers of PCB 50, the primary function of vias 70 and 72 is to add relatively large shunt capacitances $C1_V$ and $C2_V$ to PCB trace 68. Thus in accordance with the invention, vias 70 and 72 (or any other suitable source of capacitance) are added to PCB trace 68 regardless of whether the vias are used to connect PCB trace 68 to traces on other layers of PCB 50.

According to conventional practice interconnect system frequency response is optimized by minimizing shunt capacitance at the trace 68, mainly by avoiding connection of capacitive elements such as vias to the trace, and by minimizing series inductances L1 and L2, mainly by keeping conductors 60, 62, 64 and 66 as short as possible. However in accordance with the invention, system frequency response is actually improved by adding capacitances $C1_V$ and $C2_V$ to trace 68 and/or by increasing inductances L1 and L2 above their minimum levels, provided that the values of L1, L2, $C1_V$, and $C2_V$ are appropriately adjusted relative other components values C1, C2, R1, R2 and Z0 of the interconnect system.

The capacitance $C1_V$ and $C2_V$ of each via 70 and 72 arises primarily from capacitive coupling between the via and the ground and power planes 88 and 90 of PCB 58 and can be controlled by altering the distance between the vias and planes 88 and 90. In particular we can increase (or decrease) capacitance $C1_V$ of via 70 by decreasing (or increasing) the size of the holes 92 in planes 88 and 90 through which via 70 passes. The capacitance $C1_V$ of via 72 can be adjusted in a similar manner. The magnitudes of L1 and L2 can be increased by increasing the lengths of bond wires 60 and 62, increasing the lengths of package legs 64 and 66, or by adding inductive elements in series with bond wires 60 and 62.

Table II compares values of interconnect system components of the prior art equivalent circuit of FIG. 2 to values of interconnect system components of the improved interconnect system of FIG. 5 when adjusted in accordance with the invention:

TABLE II

| ELEMENT | VALUE (PRIOR ART) | VALUE (IMPROVED) |
| --- | --- | --- |
| L1 | 1nH | 3nH |
| L2 | 1nH | 3nH |
| C1 | 2pF | 2pF |
| C2 | 2pF | 2pF |
| $C1_{VIA}$ | N/A | 1.4pF |
| $C2_{VIA}$ | N/A | 1.4pF |
| Z0 | 50 Ohms | 50 Ohms |
| $R_1$ | 50 Ohms | 50 Ohms |
| $R_2$ | 50 Ohms | 50 Ohms |

Component values for Z0, R1 and R2, C1 and C2 are characteristics of the ICs and are assumed for illustrative purposes to have similar values for both prior art and improved interconnect systems. However the improved interconnect system includes the additional capacitances $C1_V$ and $C2_V$. Inductances L1 and L2 are also increased from 1 nH in the prior art interconnect system of FIG. 2 to 3 nH in the improved interconnect system of FIG. 5.

Figure 6:
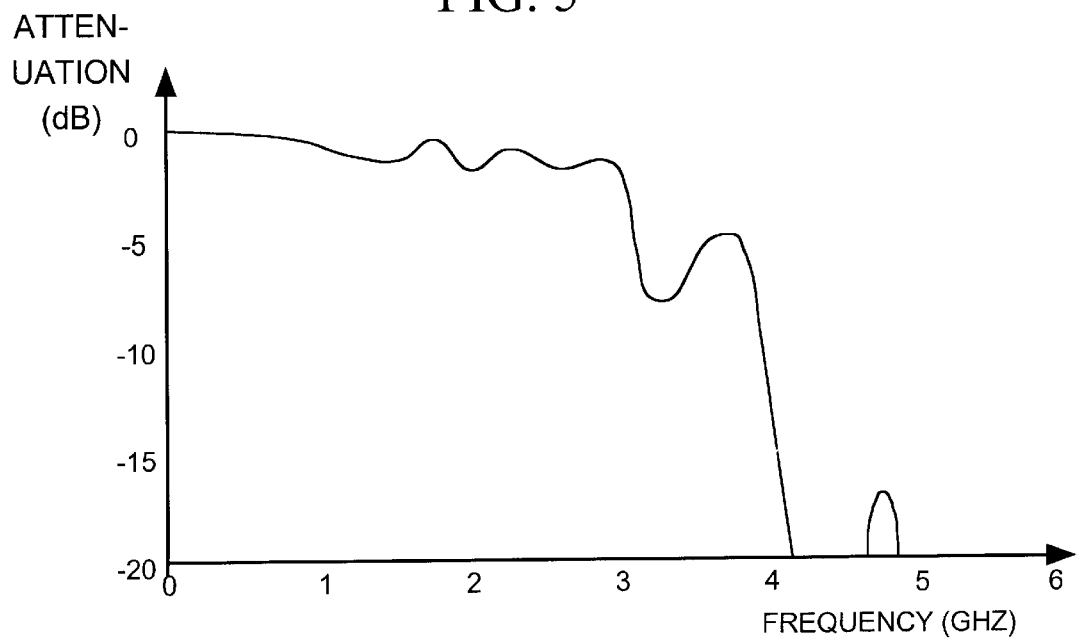
FIG. 6 illustrates the frequency response characteristics of the interconnect system of FIGS. 4 and 5.

FIG. 6 illustrates the frequency response of the interconnect system of FIG. 5 in accordance with the invention when its various component are set to the values indicated by the "improved" column of Table II. In the particular case illustrated in FIG. 6 the value of L1, L2, $C1_V$, and $C2_V$ were chosen to maximize passband power for the given values of R1, R2, C1, C2 and Z0. We maximize passband power when we maximize the average amount of signal power that may be conveyed by the various signal frequencies in the interconnect system passband (0–3 GHz). This means that for the given values of other components of FIG. 5, L1, L2, $C1_V$ and $C2_V$ are sized to maximize the total area under the frequency response curve in the passband between 0 and 3 GHz. One way to determine appropriate values of L1, L2, $C1_V$ and $C2_V$ is to use a conventional circuit simulator to simulate the circuit of FIG. 5 which produces a plot of frequency response similar to FIG. 6. The values of L1, L2, $C1_V$ and $C2_V$ that maximize passband power can be determined by iteratively adjusting their values and monitoring the frequency response.

FIG. 6 shows that the bandwidth of the improved interconnect system is approximately 3 GHz, substantially larger than the 2 GHz bandwidth of the prior art system, as illustrated in FIG. 3. Note also that the passband is relatively flatter in FIG. 6, that the stopband falls off more quickly in FIG. 6 than in FIG. 3, and that the stopband of FIG. 6 has fewer spikes. It is clear that the frequency response illustrated in FIG. 6 would be an improvement over the frequency response of FIG. 3 in an application where a 3 GHz passband is required. Thus in this case the passband power characteristic of the frequency response of the interconnect system is optimized not by providing only minimal capacitance at the PCB trace and minimal series inductance L1 and L2 as practiced in the prior art, but by providing appropriately adjusted additional capacitance $C1_V$ and $C2_V$ at the PCB trace and by appropriately increasing L1 and L2 above their minimum levels.

Butterworth and Chebyshev Filters

It should be understood that the frequency response of an interconnect system has many characteristics and that its "optimal" frequency response is application-dependent. Thus the appropriate value to which the additional PCB capacitances $C1_V$ and $C2_V$ and inductances L1 and L2 of FIG. 5 should be adjusted depends on which frequency response and impedance characteristics are most important for the particular application. In the example of FIG. 6, $C1_V$, $C2_V$, L1 and L2 were chosen to maximize the passband power. However other values of $C1_V$, $C2_V$, L1 and L2 can optimize other characteristics of the interconnect system. For example when the interconnect system is to convey a lower frequency analog signal with minimal distortion, and where band width is not so important, it may be desirable that the frequency response of the interconnect system have a "maximally flat" passband, having the least possible amount of ripple.

It is beneficial to think of the equivalent circuit of the interconnect system, as illustrated in FIG. 5, as a multiple-pole filter. By appropriately adjusting $C1_V$, $C2_V$, L1 and L2 relative to C1, C2 and the other components of the interconnect system that interconnect system can be made to behave, for example, like a well-known, multi-pole "Butterworth" filter which provides a maximally flat frequency response.

In other applications, optimal frequency response will be a tradeoff between the bandwidth, allowable passband ripple, and stopband attenuation. Accordingly the values of $C1_V$, $C2_V$, L1 and L2 can be selected so that the interconnect system behaves as a form of the well-known, multiple-pole Chebyshev filter. The design of multi-pole Butterworth and Chebyshev filters, including appropriate choices for component values so as to optimize one or more combinations of characteristics of filter's frequency response, is well-known to those skilled in the art. See for example, pages 59–68 of the book *Introduction to Radio Frequency Design* by W. H. Hayward, published 1982 by Prentice-Hall, Inc., and incorporated herein by reference.

Adjusting Other Components

It is possible to further optimize the frequency response of the interconnect system of FIG. 5 when we also have the freedom to adjust values of other components R1, R2, Z0, C1 and C2. However in practice the values of $R_1$, $R_2$ and Z0 are typically standardized by IC and PCB manufacturers to 50 ohms in high frequency applications. Capacitances C1 and C2 can be adjusted, but only by IC manufacturers, and they typically try to minimize C1 and C2. Via capacitances $C1_V$ and $C2_V$, or other sources of shunt capacitance that may be connected to the trace, and series inductances L1 and L2 may therefore be the only components of the interconnect system of FIG. 5 that are conveniently adjustable in the manner described above. However it should be understood that, where possible, any or all component values of the interconnect system of FIG. 5 can be adjusted in order to optimize its frequency response and that when we have more latitude in adjusting component values, we can attain a higher level of optimization of frequency response.

Impedance Matching

Driver output impedance R1, receiver input impedance R2 and trace impedance Z0 are typically set to similar values (e.g., 50 Ohms) to prevent signal reflections which degrade system frequency response. However in accordance with the invention, it is not necessary that $R1=R2=Z_0$ because we can compensate for impedance mismatching by appropriately adjusting L1, L2, $C1_V$ and $C2_V$. For example pages 59–68 of the above-mentioned book *Introduction to Radio Frequency Design* illustrate how to adjust other filter component values to obtain Butterworth and Chebyshev filter frequency response behavior even when R1, R2 and Z0 are dissimilar.

Other Sources of Adjustable PCB Capacitance

In the interconnect system of FIG. 4 the necessary additional PCB capacitance is obtained by providing appropriately dimensioned vias 70 and 72. This is a convenient and inexpensive way of providing such capacitance because most PCB manufactures have the capability of adding appropriately sized vias to a PCB. Use of vias to provide this capacitance has the added benefit of allowing signals to travel to PCB traces such as PCB traces (not shown in FIG. 4) on other PCB layers thereby adding to the flexibility with which a designer can lay out a high frequency PCB. It should be understood, however, that while the necessary PCB capacitance can be conveniently obtained by using vias 70 and 72, such additional capacitance can also be provided by other means, for example by connecting appropriately sized discrete capacitors between PCB trace 68 and ground plane 88.

Figure 7:
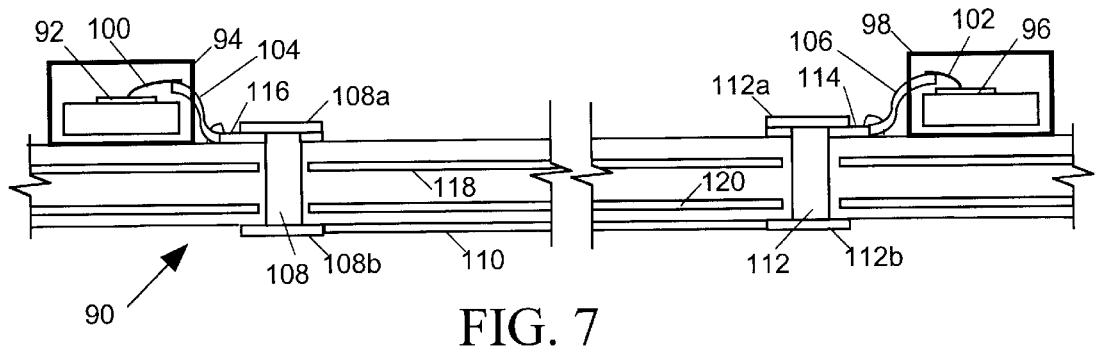
FIG. 7 is a simplified sectional elevation view of a portion of a printed circuit board upon which is mounted a pair of integrated circuits, wherein the integrated circuits are interconnected in accordance with a second embodiment of the present invention.

FIG. 7 illustrates a PCB 90 implementing an improved interconnect system in accordance with a second embodiment of the present invention for interconnecting a bond pad 92 in one IC 94 to a bond pad 96 in another IC 98. Bond wires 100 and 102 connect pads 92 and 96 to package legs 104 and 106. Package leg 104 is linked by a short trace 116 to an upper annular ring 108a of a conductive via 108 passing through PCB 90 and contacting a PCB trace 110 on the lower surface of PCB 90 through a lower annular ring 108b of via 108. Similarly, package leg 106 is linked by another short trace 114 to an upper annular ring 112a of a conductive via 112 passing through PCB 90 and contacting PCB trace 110 on the lower surface of PCB 90 through a lower annular ring 112b of via 112.

Figure 8:
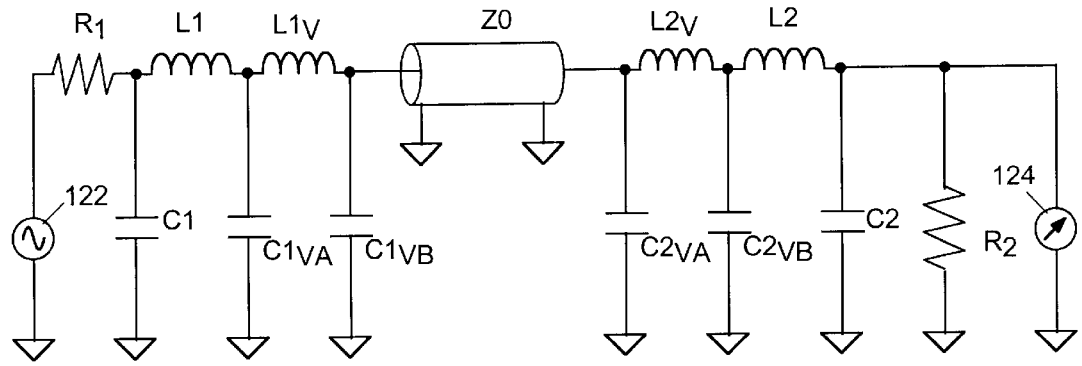
FIG. 8 is an equivalent circuit diagram modeling the ICs of FIG. 7 and the structure interconnecting them.

FIG. 8 is an equivalent circuit diagram of the interconnect system of FIG. 7 in accordance with the invention. A driver 122 within IC 94 is connected to pad 92 through impedance $R_1$ and a receiver 124 having input impedance $R_2$ within IC 98 is connected to pad 96. Bond wire 100, package leg 104 and trace 116 are modeled as inductance L1 while bond wire 102, package leg 106 and trace 114 are modeled as inductance L2. The capacitances of pads 92 and 96 appear in FIG. 7 as capacitors C1 and C2 and the impedance of PCB trace 110 appears as its characteristic impedance Z0. Upper and lower annular rings 108a and 108b of via 108 have parallel capacitances $C1_{VA}$ and $C1_{VB}$ relative to the ground and power planes 118 and 120 embedded within PCB 90. The inductance of via 108 appears in FIG. 8 as inductor $L1_V$. Similarly, via 112 has inductance $L2_V$ and capacitances $C2_{VA}$ and $C2_{VB}$ associated with it's annular rings 112A and 112B.

The capacitances $C1_{VA}$ and $C1_{VB}$ of via 108 arise primarily from capacitive coupling between annular rings 108a and 108b of the via and the ground and power planes 118 and 120 of PCB 90 and are a function of the area of the rings and the amount of horizontal overlap and vertical distance between the annular rings and the ground and power planes 118 and 120 of PCB 90. The capacitances $C2_{VA}$ and $C2_{VB}$ associated with annular rings 112a and 112b of via 112 are similar functions of the ring's area and overlap with and distance from the ground and power planes 118 and 120.

FIG. 8 shows that the interconnect system linking pad 92 of IC 94 to pad 96 of IC 98 behaves as a multiple-pole filter, and in accordance with the invention, magnitudes of the various capacitive and inductive impedance components of the interconnect system are tuned relative to one another so as to optimize characteristics of its frequency response. We can adjust the size of bond pads 92 and 96 and any internal capacitive elements such as electrostatic discharge protection devices within ICs 94 and 98 linked to bond pads 92 and 96 to adjust the magnitudes of capacitances C1 and C2. We can adjust the lengths of IC package pins 104 and 106 and bond wires 100 and 102 to adjust the inductances L1 and L2. We can adjust the thickness of PCB 90 to adjust the lengths of vias 108 and 112 which in turn control the via's inductances $L1_V$ and $L2_V$. We can adjust the diameters of annular rings 108a, 108b, 112a and 122b at the upper and lower ends of vias 108 and 112 and their overlaps with and vertical spacings from ground and power planes 114 and 120 to adjust the magnitudes of capacitances $C1_{VA}$, $C1_{VB}$, $C2_{VA}$ and $C2_{VB}$.

We may have some degree of freedom to adjust the internal capacitances C1, C2, L1 and L2 of ICs 94 and 98 when those ICs and their interconnect system are designed together, but otherwise capacitances C1 and C2 and inductances L1 and L2 are typically fixed by the choice of ICs 94 and 98. Generally the IC packaging choice controls the lengths of pins 104 and 106, and the number of layers PCB 90 needs for signal routing purposes normally determines the thickness of PCB 90. Thus we may also have little latitude in adjusting inductance $L1_V$ and $L2_V$. Also, since we often want to standardize impedances of traces on the top and bottom surfaces of PCB 90 (for example to 50 Ohms) for other reasons, we may have little latitude in adjusting the vertical spacing of ground and power planes 118 and 120 relative to the via's upper and lower annual rings 108a, 108b, 112a and 112b. That spacing influences values of capacitances $C1_{VA}$, $C1_{VB}$, $C2_{VA}$ and $C2_{VB}$. However since we can freely adjust the diameters of annular rings 108a, 108b, 112a and 112b and the amount of overlap between those rings and nearby power and ground layers 118 and 120, we normally will have a relatively wide latitude in adjusting capacitances $C1_{VA}$, $C1_{VB}$, $C2_{VA}$ and $C2_{VB}$.

Thus when trace impedances Z0, internal IC capacitances C1 and C2, inductances $L1_V$, $L2_V$, L1 and L2 are fixed by other considerations, we adjust the capacitances $C1_{VA}$, $C1_{VB}$, $C2_{VA}$ and $C2_{VB}$ relative to the other impedance values of FIG. 8 to optimize desired frequency characteristics of the interconnect system. For example magnitudes of capacitances $C1_{VA}$, $C1_{VB}$, $C2_{VA}$ and $C2_{VB}$ that maximize interconnect system bandwidth will be somewhat higher than their minimum attainable values.

As discussed above, persons of ordinary skill in the art are well-acquainted with methods for determining component values of multiple-pole filters which optimize their frequency response characteristics. For example one way to determine optimal values for via capacitances given fixed values for all other impedances is to use a conventional circuit simulator to determine the frequency response characteristics of the interconnect structure over a wide range of via capacitance values. Conventional search techniques can be used to find combinations of component values providing optimal simulated interconnect circuit frequency response when several component values are freely adjustable.

Figure 9:
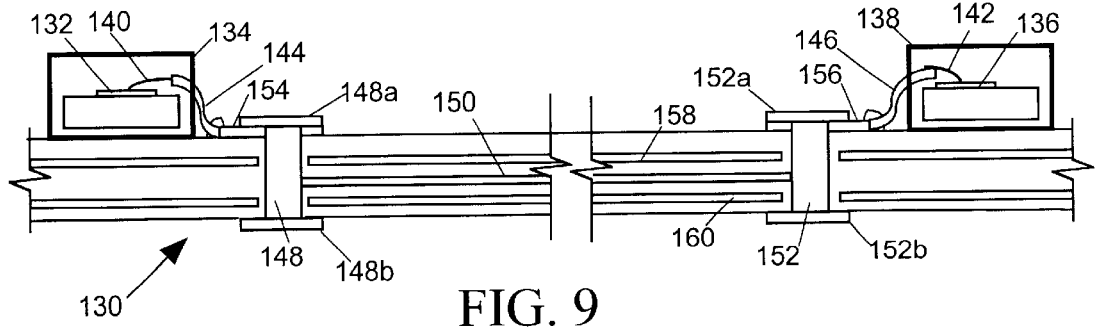
FIG. 9 is a simplified sectional elevation view of a portion of a printed circuit board upon which is mounted a pair of integrated circuits, wherein the integrated circuits are interconnected in accordance with a third embodiment of the present invention.

FIG. 9 illustrates a PCB 130 implementing an improved interconnect system in accordance with a third embodiment of the invention for interconnecting a bond pad 132 in one IC 134 to a bond pad 136 in another IC 138. Bond wires 140 and 142 connect pads 132 and 136 to package legs 144 and 146. Package leg 144 is linked by a short trace 154 to an upper annular ring 148a of a conductive via 148 passing through PCB 130 and contacting a PCB trace 150 located on an inner layer of PCB 130. Similarly, package leg 146 is linked by a short trace 156 to an upper annular ring 152a of a conductive via 152 passing through PCB 130 and contacting PCB trace 150.

Figure 10:
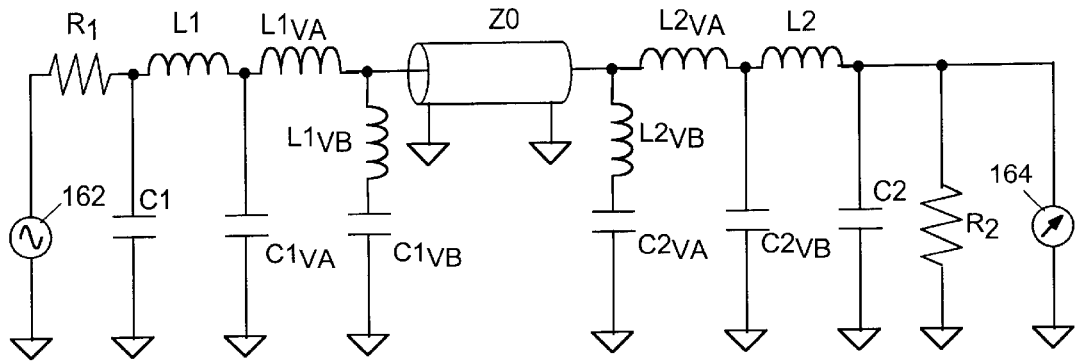
FIG. 10 is an equivalent circuit diagram modeling the ICs of FIG. 9 and the structure interconnecting them.

FIG. 10 is an equivalent circuit diagram of the interconnect system of FIG. 9 in accordance with the invention. A driver 162 within IC 134 is connected to pad 132 through impedance $R_1$ and a receiver 164 having input impedance $R_2$ within IC 138 is connected to pad 136. Bond wire 140, package leg 144 and trace 154 are modeled as inductance L1 while bond wire 142, package leg 146 and trace 156 are modeled as inductance L2. The capacitances of pads 132 and 136 appear in FIG. 7 as capacitors C1 and C2 and the impedance of PCB trace 146 appears as its characteristic impedance Z0. Upper and lower annular rings 148a and 148b of via 148 have parallel capacitances $C1_{VA}$ and $C1_{VB}$ relative to the ground and power planes 118 and 120 embedded within PCB 90. Similarly, via 152 has capacitances $C2_{VA}$ and $C2_{VB}$ associated with it's annular rings 152A and 152B. Since trace 150 connects to via 148 inside PCB 130, the inductance of via 148 appearing in FIG. 10 is divided into components representing a series inductance $L1_{VA}$ of via 148 between package leg 144 and trace 150 and a shunt inductance $L1_{VB}$ of via 148 between trace 150 and capacitance $C1_{VB}$. The inductance of via 152 is similarly divided into series inductance $L2_{VA}$ and shunt inductance $L2_{VB}$. The values of the capacitances and inductances of vias 148 and 152 can be adjusted in a manner similar to that described above with respect to FIG. 8 to optimize the frequency response of the interconnect system of FIGS. 9 and 10 in accordance with the invention.

While the forgoing specification has described preferred embodiment(s) of the present invention, one skilled in the art may make many modifications to the preferred embodiments without departing from the invention in its broader aspects. For example, while in the interconnect systems illustrated herein employ bond wires and package legs to connect nodes of ICs to PCB traces, other types of inductive conductors, such as for example spring wires, could be employed to connect nodes of an integrated circuit to a PCB trace. Also, the interconnect system of the present invention may be employed to interconnect circuits other than integrated circuits. The appended claims therefore are intended to cover all such modifications as fall within the true scope and spirit of the invention.

What is claimed is:

1. An interconnect system for conductively linking a node of an integrated circuit mounted on an upper surface of a printed circuit board (PCB) to an external circuit, the node having first capacitance, wherein the PCB also has a lower surface, the interconnect system comprising:

a trace formed on said PCB and vertically spaced below the upper surface of the PCB, a conductor having first inductance; and a via terminating at the upper surface of the PCB, the via providing a conductive path extending vertically within the PCB to the trace, the via having second capacitance and second inductance, wherein said conductor links the node to the via, and wherein the second capacitance is sized to satisfy a relationship between the second capacitance, the first inductance, the second inductance, and the first capacitance.

2. The interconnect system in accordance with claim 1 wherein said second capacitance is sized to substantially optimize a frequency response characteristic of the interconnect system.

3. The interconnect system in accordance with claim 2 wherein said frequency response characteristic is one of maximal passband width, maximal passband flatness, and maximal passband power.

4. The interconnect system in accordance with claim 1 wherein said second capacitance is sized so that said interconnect system acts substantially as a multiple-pole Butterworth filter.

5. The interconnect system in accordance with claim 1 wherein said second capacitance is sized so that said interconnect system acts substantially as a multiple-pole Chebyshev filter.

6. The interconnect system in accordance with claim 1 wherein said trace resides on said lower surface of said PCB.

7. The interconnect system in accordance with claim 1 wherein said trace is vertically spaced between said upper and lower surfaces of said PCB.

8. The interconnect system in accordance with claim 1 wherein said via comprises:

a conductive column extending vertically within the PCB, a conductive lower annular ring linked to said conductive column and mounted on said lower surface of said PCB; and a conductive upper annular ring mounted on said upper surface of said PCB and linked to said column, said conductor attached to the conductive upper annular ring.

9. An interconnect system for linking a first node of a first integrated circuit (IC) mounted on an upper surface of a printed circuit board (PCB) to a second node of a second IC mounted on the upper surface of the PCB, the PCB also having a lower surface, the first node having first capacitance, the second node having second capacitance, the interconnect system comprising:

a first via terminating at the upper surface of the PCB and providing a conductive path extending vertically within the PCB, the first via having third capacitance and third inductance;

a second via terminating at the upper surface of the PCB and providing a conductive path extending vertically within the PCB, the second via having fourth capacitance and fourth inductance;

a trace linking said first via to said second via, the trace formed on said PCB and vertically spaced below the upper surface of the PCB;

a first conductor having first inductance and linking the first node to the first via, a second conductor having second inductance and linking the second via to the second node, and wherein sizes of the third and fourth capacitances are chosen to satisfy a relationship between the first, second, third and fourth capacitances, and the first, second, third and fourth inductances.

10. The interconnect system in accordance with claim 9 wherein said third and fourth capacitances are sized to substantially optimize a frequency response characteristic of the interconnect system.

11. The interconnect system in accordance with claim 10 wherein said frequency response characteristic is one of maximal passband width, maximal passband flatness, and maximal passband power.

12. The interconnect system in accordance with claim 9 wherein said third and fourth capacitances are sized so that said interconnect system acts substantially as a multiple-pole Butterworth filter.

13. The interconnect system in accordance with claim 9 wherein said third and fourth capacitances are sized so that said interconnect system acts substantially as a multiple-pole Chebyshev filter.

14. The interconnect system in accordance with claim 9 wherein said trace resides on said lower surface of said PCB.

15. The interconnect system in accordance with claim 9 wherein said trace is spaced vertically between said upper and lower surfaces of said PCB.

16. The interconnect system in accordance with claim 9 wherein said first via comprises:

a conductive column extending vertically within the PCB, a conductive lower annular ring linked to said conductive column and mounted on said lower surface of said PCB; and a conductive upper annular ring mounted on said upper surface of said PCB and linked to said conductive column, said first conductor attached to the conductive upper annular ring.

17. The interconnect system in accordance with claim 16 wherein said second via comprises:

a conductive column extending vertically within the PCB, a conductive lower annular ring linked to said conductive column and mounted on said lower surface of said PCB; and a conductive upper annular ring mounted on said upper surface of said PCB and linked to said conductive column, said second conductor attached to the conductive upper annular ring.

18. A method for linking a node of an integrated circuit mounted on an upper surface of a printed circuit board (PCB) to an external circuit, the node having first capacitance, wherein the PCB also has a lower surface, the method comprising the steps of:

a. forming a trace on the PCB vertically spaced below the upper surface of the PCB, b. providing a conductor having first inductance; and c. designing and providing a via terminating at the upper surface of the PCB and providing a conductive path extending vertically within the PCB to the trace, the via having second capacitance and second inductance, wherein said conductor links the node to the via, and wherein size of the second capacitance is selected in relation to the first capacitance, the first inductance and the second inductance when designing the via at step c.

19. The method in accordance with claim 18 wherein said second capacitance is selected from a range of via capacitances when designing the via at step c so that the second capacitance substantially optimizes a frequency response characteristic of an interconnect system comprising said conductor and said via.

20. The method in accordance with claim 19 wherein said frequency response characteristic is one of maximal passband width, maximal passband flatness, and maximal passband power.

21. The method in accordance with claim 18 wherein said second capacitance is sized so that an interconnect system comprising said conductor and said via acts substantially as a multiple-pole Butterworth filter.

22. The method in accordance with claim 18 wherein said second capacitance is sized so that an interconnect system comprising said conductor and said via acts substantially as a multiple-pole Chebyshev filter.

23. The method in accordance with claim 18 wherein said trace resides on said lower surface of said PCB.

24. The method in accordance with claim 18 wherein said trace is spaced vertically between said upper and lower surfaces of said PCB.

25. The method in accordance with claim 18 wherein said via designed in step c comprises:

a conductive column extending vertically within the PCB, a conductive lower annular ring linked to said conductive column and mounted on said lower surface of said PCB; and a conductive upper annular ring mounted on said upper surface of said PCB and linked to said conductive column, said conductor attached to the conductive upper annular ring.

26. A method for linking a first node of a first integrated circuit (IC) mounted on an upper surface of a printed circuit board (PCB) to a second node of a second IC mounted on the upper surface of the PCB, the first node having first capacitance, the second node having second capacitance, the PCB also having a lower surface, the method comprising the steps of:

a. designing and providing a first via terminating at the upper surface of the PCB and providing a conductive path extending vertically within the PCB, the first via having third capacitance and second inductance;

b. designing and providing a second via terminating at the upper surface of the PCB and providing a conductive path extending vertically within the PCB, the second via having fourth capacitance and third inductance;

c. providing a trace vertically spaced below the upper surface of the PCB, the trace linking the first and second vias;

d. providing a first conductor having first inductance and linking the first node to the first via; and e. providing a second conductor having fourth inductance and linking the second via to the second node, wherein the third and fourth capacitances are sized to satisfy a relationship between the first, second, third and fourth capacitances, and the first, second, third and fourth inductances.

27. The method in accordance with claim 26 wherein sizes of said third and fourth capacitances are selected from a range of via capacitances when designing the vias at steps b and c so that the third and fourth capacitances substantially optimize a frequency response characteristic of an interconnect system comprising said first and second conductors, said first and second vias and said trace.

28. The method in accordance with claim 27 wherein said frequency response characteristic is one of maximal passband width, maximal passband flatness, and maximal passband power.

29. The method in accordance with claim 26 wherein said third and fourth capacitances of said first and second vias designed at steps a and b are sized so that said first and second conductors, said first and second vias and said trace acts substantially as a multiple-pole Butterworth filter.

30. The method in accordance with claim 26 wherein said third and fourth capacitances of said first and second vias designed at steps b and c are sized so that said first and second conductors, said first and second vias and said trace acts substantially as a multiple-pole Chebyshev filter.

31. The method in accordance with claim 26 wherein said trace is mounted on said lower surface of said PCB.

32. The method in accordance with claim 26 wherein said trace is spaced vertically between said upper and lower surfaces of said PCB.

33. The method in accordance with claim 26 wherein of said first via designed at step b comprises:

a conductive column extending vertically within the PCB, a conductive lower annular ring linked to said conductive column and mounted on said lower surface of said PCB; and a conductive upper annular ring mounted on said upper surface of said PCB and linked to said conductive column, said first conductor attached to the conductive upper annular ring.

34. The method in accordance with claim 33 wherein of said second via designed at step b comprises:

a conductive column extending vertically within the PCB, a conductive lower annular ring linked to said conductive column and mounted on said lower surface of said PCB; and a conductive upper annular ring mounted on said upper surface of said PCB and linked to said conductive column, said second conductor attached to the conductive upper annular ring.

* * * * *